US008138097B1

(12) United States Patent
Isobayashi et al.

(10) Patent No.: US 8,138,097 B1
(45) Date of Patent: Mar. 20, 2012

(54) METHOD FOR PROCESSING SEMICONDUCTOR STRUCTURE AND DEVICE BASED ON THE SAME

(75) Inventors: Atsunobu Isobayashi, Clifton Park, NY (US); Masao Ishikawa, Malta, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/886,106

(22) Filed: Sep. 20, 2010

(51) Int. Cl.
*H01L 21/302* (2006.01)
*H01L 21/461* (2006.01)

(52) U.S. Cl. .................. 438/736; 438/689; 257/E21.231
(58) Field of Classification Search .................. 438/689, 438/736; 257/E21.231
See application file for complete search history.

(56) References Cited

U.S. PATENT DOCUMENTS

| 5,343,107 A | * | 8/1994 | Shikata et al. ............ 310/313 A |
| 5,580,668 A | | 12/1996 | Kellam |
| 6,221,562 B1 | | 4/2001 | Boyd et al. |
| 6,794,288 B1 | | 9/2004 | Kolics et al. |
| 6,902,605 B2 | | 6/2005 | Kolics et al. |
| 2009/0209105 A1 | * | 8/2009 | Yaegashi et al. ............ 438/694 |

FOREIGN PATENT DOCUMENTS

| JP | 08055920 | 2/1996 |
| JP | 2002110510 | 4/2002 |
| JP | 2006019351 | 1/2006 |
| JP | 2006093670 | 4/2006 |
| JP | 2006286932 | 10/2006 |
| JP | 2008091925 | 4/2008 |
| JP | 2008300833 | 12/2008 |
| JP | 2009218574 | 9/2009 |
| JP | 2009301007 | 12/2009 |
| WO | 2007040057 | 4/2007 |

OTHER PUBLICATIONS

Inoue, et al; Fluorine Incorporation into HfSiON Dielectric for Vth Control and Its Impact on Reliability for Poly-Si Gate pFET, IEDM 2005 Dig.

Sen, et al; Effects of aluminum incorporation on hafnium oxide filmm using plasma immersion ion implantation, Microelectronics Reliability 48 (2008), pp. 1765-1768.

Xiong, et al.; Impact of incorporated Al on the TiN/HfO2 interface effective work function, Journal of Applied Physics 104, 074501 (2008), pp. 074501-1-074501-6.

* cited by examiner

*Primary Examiner* — Alexander G. Ghyka
*Assistant Examiner* — Seavosh Nikmanesh
(74) *Attorney, Agent, or Firm* — Turocy & Watson, LLP

(57) ABSTRACT

Methods for fabricating a device and related device structures are provided herein. According to one embodiment, a method for fabricating a device includes the acts of producing a substrate; forming a structure on the substrate having a lower dielectric layer, a metal layer, an upper dielectric layer, a planarizing layer, and a layer of photoresist material; developing the photoresist material according to a mask pattern; etching the planarizing layer and the upper dielectric layer according to the mask pattern; removing the photoresist material and the planarizing layer upon etching of the planarizing layer and the upper dielectric layer; applying a selective metal growth or metal/organic film to respective exposed portions of the metal layer following etching of the upper dielectric layer, thereby obtaining an inverted mask pattern; and etching at least the metal layer and the lower dielectric layer according to the inverted mask pattern.

19 Claims, 11 Drawing Sheets

Metal Layer 1 520      Metal/Organic Film 910

Dielectric 2 530

Metal Layer 1 520      Metal/Organic Film 910

Dielectric 2 530

METHOD FOR PROCESSING SEMICONDUCTOR STRUCTURE AND DEVICE BASED ON THE SAME

FIELD

Embodiments described herein relate generally to semiconductor devices and methods for fabricating semiconductor devices.

BACKGROUND

Silicon large-scale integrated circuits, among other device technologies, are increasing in use in order to provide support for the advanced information society of the future. An integrated circuit can be composed of respective semiconductor devices, such as transistors or the like, which can be produced according to a variety of techniques. By way of example, high-performance semiconductor devices can be fabricated using photolithography. In the process of photolithography, a mask pattern is transferred via light to a light-sensitive photoresist material on a semiconductor device substrate. Subsequently, techniques such as chemical treatments are utilized to engrave the transferred pattern into the material beneath the photoresist (e.g., by removing material on the substrate not located under the photoresist).

As semiconductor device features have become smaller and more advanced, conventional patterning techniques utilized in connection with photolithography have been limited in their ability to produce finely defined features, such as trenches or the like. Accordingly, to enhance the ability of existing semiconductor device fabrication techniques to create the smaller features demanded by high-performance devices, patterning techniques such as double patterning, tone-inversion patterning, or the like can be utilized. However, such patterning schemes can in some cases be ineffective at accurately recreating a desired feature set. Further, such patterning schemes can be susceptible to cracking, delamination, and/or other manufacturing defects. Accordingly, it would be desirable to implement techniques for producing semiconductor devices with features of varying sizes with minimal potential for defects in fabrication.

DETAILED DESCRIPTION

Figure 1:
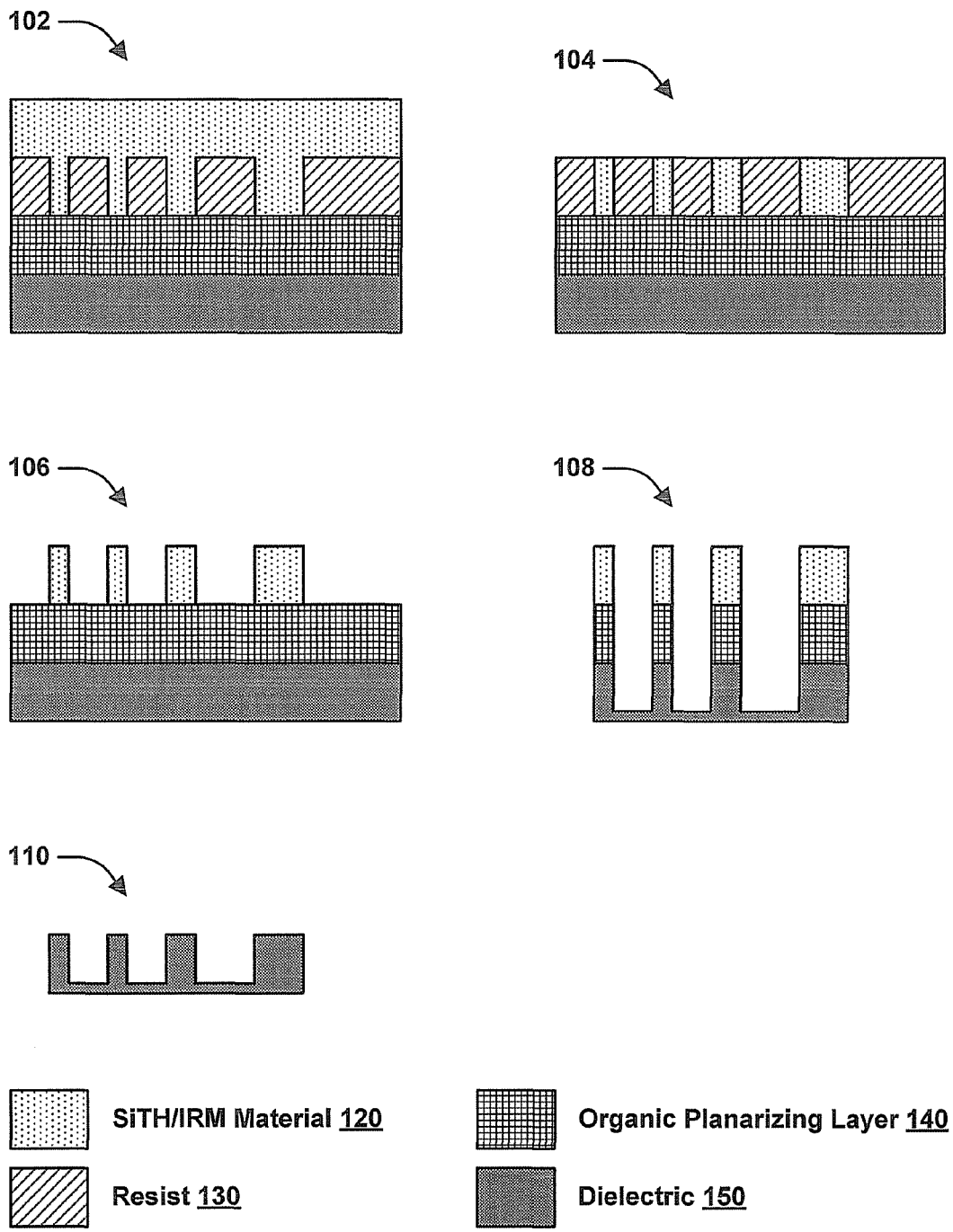
FIG. 1 illustrates a tone-inversion patterning process that can be utilized for semiconductor device fabrication in accordance with an embodiment of the subject innovation.

The subject innovation provides methods of fabricating a semiconductor device via improved tone inversion photolithography techniques. In various embodiments, semiconductor device fabrication can be performed via etching one or more layers of a semiconductor device structure using photoresist material as a mask in a similar manner to conventional non-tone inversion lithography. The etching can be performed until it stops at the top of a metal layer formed below a first dielectric layer, after which selective metal growth or metal/organic film can be deposited by electroless deposition, epitaxial growth, chemical vapor deposition (CVD), physical vapor deposition (PVD), atomic layer deposition (ALD), and/or other techniques. If present, any overburden of the deposited material can be removed via chemical-mechanical planarization (CMP) or etchback. Subsequently, the deposited material can be utilized as a hardmask that is substantially identical to the inversion of the original photoresist pattern, thereby enabling etching of a second dielectric layer formed below the metal layer according to a desired tone inversion pattern. In addition, semiconductor device products exhibiting a structure that can be utilized for device fabrication according to various embodiments herein are provided.

According to one embodiment, a method for fabricating a semiconductor device includes the acts of producing a substrate; forming a semiconductor structure on the substrate having a lower dielectric layer on the substrate, a metal layer on the lower dielectric layer, an upper dielectric layer on the metal layer, a planarizing layer on the upper dielectric layer, and a layer of photoresist material on the planarizing layer; developing the photoresist material according to a mask pattern; etching the planarizing layer and the upper dielectric layer according to the mask pattern; removing the photoresist material and the planarizing layer upon etching of the planarizing layer and the upper dielectric layer; applying a selective metal growth to respective exposed portions of the metal layer following etching of the upper dielectric layer in order to obtain an inverted mask pattern composed of the selective metal growth; and etching at least the metal layer and the lower dielectric layer according to the inverted mask pattern.

In an example, the upper dielectric layer can be removed prior to etching the metal layer and the lower dielectric layer. In another example, the selective metal growth can be applied via, e.g., electroless plating, epitaxial growth, CVD, PVD, or ALD. The upper dielectric layer can have a thickness that is, e.g., between approximately 10 nm and approximately 100 nm. Additionally or alternatively, the metal layer can have a thickness that is, e.g., between approximately 5 nm and approximately 20 nm. The selective metal growth can be composed of at least one element, which can include, but is not limited to, Co, Ni, Cu, Fe, Ru, Rh, Pd, Ag, Os, Ir, Sn, Pb, Pt, and/or Au. Further, the selective metal growth can include at least one co-deposit metal that can be composed of at least one element that can include, but is not limited to, V, Cr, Mn, Mo, Tc, W, Re, In, Ti, Zn, Si, Ge, and/or B. In further examples, further processing, such as removal of the selective metal growth and the metal layer following etching of the metal layer and the lower dielectric layer, metallization of one or more removed portions of the lower dielectric layer post-etching, and formation of a cap layer on the lower dielectric layer after metallization, can be performed.

According to one embodiment, a method for fabricating a semiconductor device includes the acts of producing a substrate; forming a semiconductor structure on the substrate having a lower dielectric layer on the substrate, a metal layer on the lower dielectric layer, an upper dielectric layer on the metal layer, a planarizing layer on the upper dielectric layer, and a layer of photoresist material on the planarizing layer; developing the photoresist material according to a mask pattern; etching the planarizing layer and the upper dielectric layer according to the mask pattern; removing the photoresist material and the planarizing layer upon etching of the planarizing layer and the upper dielectric layer; depositing a metal or organic film on the upper dielectric layer and respective exposed portions of the metal layer following etching of the upper dielectric layer; removing respective portions of the metal or organic film that are located on one or more portions of the upper dielectric layer in order to obtain an inverted mask pattern composed of the metal or organic film; and etching at least the metal layer and the lower dielectric layer according to the inverted mask pattern.

In an example, the upper dielectric layer can be removed prior to etching the metal layer and the lower dielectric layer. In another example, the metal or organic film can be applied via, e.g., electroless plating, epitaxial growth, CVD, PVD, or ALD. The upper dielectric layer can have a thickness that is, e.g., between approximately 10 nm and approximately 100 nm. Additionally or alternatively, the metal layer can have a thickness that is, e.g., between approximately 5 nm and approximately 20 nm. In one example, the metal or organic film can be a metal film that is composed of at least one material including, but not limited to, W, Cu, Ti, TiN, Ru, Ta, TaN, Co, Ni, and/or Si, carbon combined with one or more of these materials, or an alloy combined with one or more of these materials. In another example, the metal or organic film can be an organic film composed of amorphous carbon. In some examples, the metal or organic film can have a thickness that is, e.g., between approximately 10 nm and approximately 300 nm. In other examples, deposition of the metal or organic film can be achieved by depositing an initial layer of metal or organic film on the upper dielectric layer and respective exposed portions of the metal layer following etching of the upper dielectric layer and depositing a primary layer of metal or organic film on the initial layer of metal or organic film. In such an example, the initial film layer can be composed of, e.g., at least one of Ti, TiN, Ta, or TaN, and can exhibit a thickness that is, e.g., between approximately 1 nm and approximately 10 nm. In further examples, further processing, such as removal of the metal or organic film and the metal layer following etching of the metal layer and the lower dielectric layer, metallization of one or more removed portions of the lower dielectric layer post-etching, and formation of a cap layer on the lower dielectric layer after metallization, can be performed.

According to a further embodiment, a semiconductor product includes a substrate and a semiconductor region formed on the substrate. The semiconductor region can be composed of a lower dielectric layer formed in the semiconductor region, a metal layer deposited onto the lower dielectric layer, an upper dielectric layer formed onto the metal layer, a planarizing layer formed onto the upper dielectric layer, and photoresist material deposited onto the planarizing layer. The photoresist material can be configured to be selectively removed according to a mask pattern. Further, the planarizing layer and the upper dielectric layer can be configured for etching according to the mask pattern. In addition, one or more regions of the metal layer can be configured to receive selective metal growth, metal film, and/or organic film, such that this material forms an inverted mask pattern for etching of at least the metal layer and the lower dielectric layer The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices may be shown in block diagram form in order to facilitate describing the claimed subject matter. In addition, it should be appreciated that for simplicity of illustration, the features illustrated by the drawings provided herein are not illustrated to scale within the respective drawings and/or between drawings and that, unless explicitly stated otherwise, the drawings provided herein are not intended to convey scaling relationships between respective illustrated features.

Referring first to FIG. 1, a tone-inversion patterning process that can be utilized for semiconductor device fabrication is illustrated. In one example, tone-inversion patterning (or tone-inversion lithography) is a photolithography process that can be utilized for the manufacturing of semiconductor devices, such as transistors, wiring structure on a semiconductor substrate, or the like. For example, the patterning process illustrated by FIG. 1 can be utilized to process a semiconductor wafer into one or more transistors, integrated circuits (e.g., respectively comprising one or more transistors and/or other features), etc. Prior to the acts illustrated by FIG. 1, a semiconductor wafer can be prepared for photolithography by cleaning the wafer utilizing wet cleaning and/or other suitable techniques for removing contaminants from the wafer surface. Additionally or alternatively, the wafer can be heated and/or placed through further chemical treatment to remove moisture present on the wafer surface prior to further processing. At this stage, the semiconductor wafer can include a dielectric 150 beneath an organic planarizing layer 140. Alternatively, one or both of such layers can be applied to the semiconductor wafer prior to further processing.

Upon preparation of the semiconductor wafer for photolithography, a layer of photoresist or resist 130 is applied to the surface of the wafer via spin coating and/or other suitable techniques. Upon application of resist 130 and removal of any excess resist 130 from the wafer, the resist 130 is exposed to a pattern of ultraviolet light and/or other light at a substantially high intensity, thereby enabling a chemical development process to remove respective portions of the resist 130 based on the light pattern. According to an embodiment, resist 130 that is removed via development can vary based on the properties of the resist 130. For example, if resist 130 is a positive photoresist, the resist 130 will become soluble in chemicals applied during development, thereby being removed during the development stage, upon being exposed to the light pattern. Alternatively, if the resist 130 is a negative photoresist, the resist 130 can initially be soluble in chemicals applied during development and become insoluble in such chemicals upon exposure to the light pattern.

Subsequent to photoresist exposure and development, a resist pattern can be left on the semiconductor wafer, as shown by diagram 102 in FIG. 1. Next, as further shown in diagram 102, a further coating of silicon tetrahydride (SiTH) or an industry reference material (IRM) 120 can be applied over the patterned resist 130. The SiTH/IRM material 120 can then subsequently be reduced through etchback, CMP, and/or other means as shown by diagram 104 such that the SiTH/IRM material 120 is level with the resist 130. The resist 130 can then be removed as shown by diagram 106, leaving behind the SiTH/IRM material 120 above the organic planarizing layer 140 in a pattern that is substantially the inverse of the pattern utilized for the resist 130. Based on the pattern of SiTH/IRM material 120, etching can be performed on the organic planarizing layer 140 and dielectric 150 to remove areas of said layers not protected by the SiTH/IRM material 120. Finally, as shown by diagram 110, the SiTH/IRM material 120 and organic planarizing layer 130 can be removed, leaving behind the dielectric 150 etched in the inverted pattern created by SiTH/IRM material 120 and resist 130.

Figure 2:
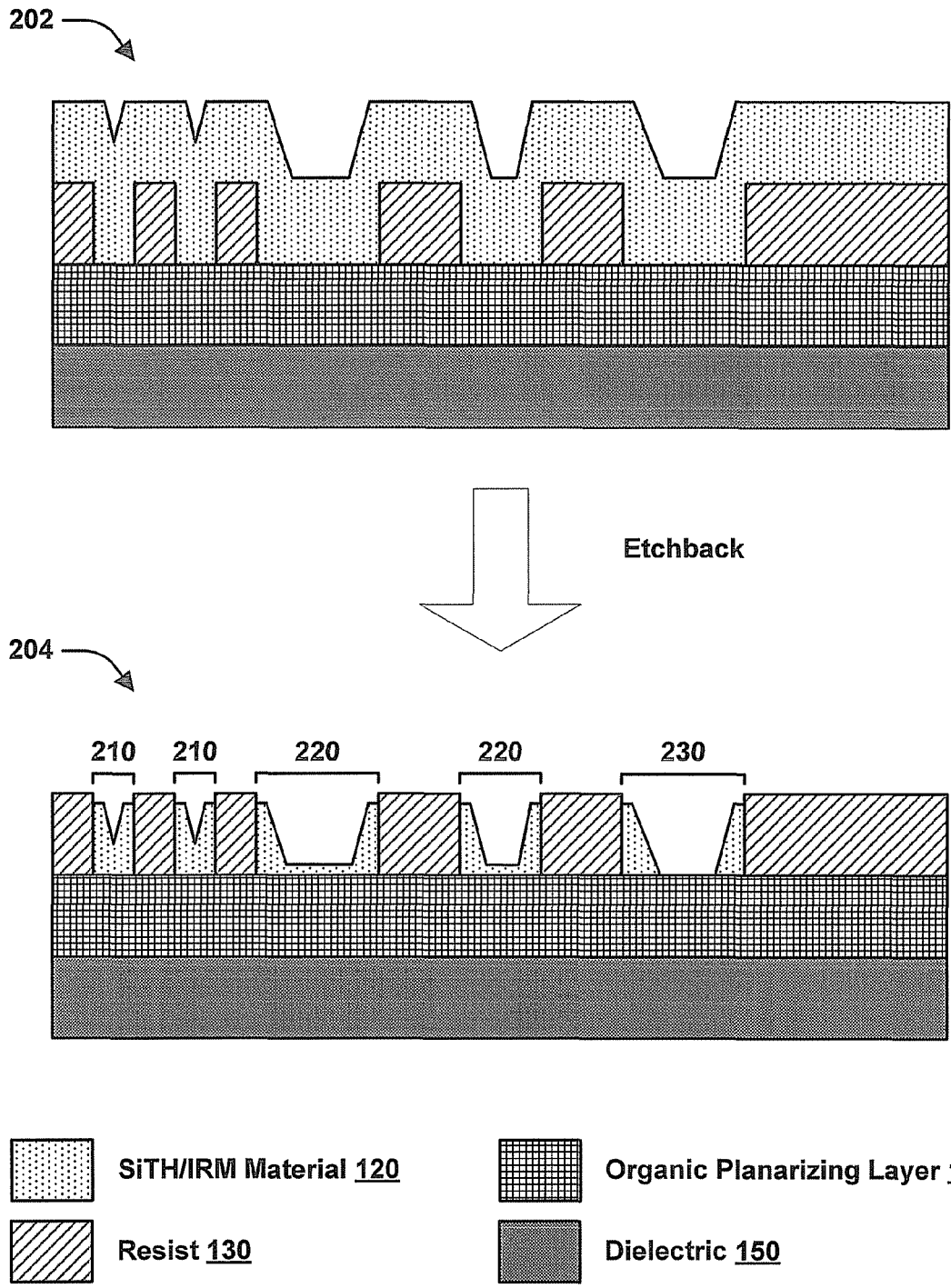
FIGS. 2 to 4 illustrate respective defects that can occur from usage of comparative tone-inversion lithography schemes in accordance with an embodiment of the subject innovation.

According to an embodiment, the tone-inversion patterning scheme illustrated by FIG. 1 can be utilized to create trenches and/or other substantially small features on a semiconductor wafer and/or other semiconductor device. However, for real world semiconductor manufacturing operations, it has been observed that tone-inversion lithography has a number of shortcomings. As a first example, in the event that a semiconductor device is desired to have features with substantially narrow pitch as well as features with substantially wide pitch, conventional tone-inversion lithography can in some cases cause defects in the features with substantially wide pitch. This is illustrated by diagrams 202-204 in FIG. 2. As diagram 202 in FIG. 2 illustrates, image transfer techniques such as tone inversion involve application of a SiTH/IRM material 120 and/or other hardmask material that can subsequently be utilized to etch to the dielectric 150 below. Further, subsequent to application of the hardmask material, excess hardmask material is removed in a similar manner to that illustrated by diagram 104 in FIG. 1.

As shown in diagram 202, one technique that can be utilized to remove excessive hardmask material is an etchback. As FIG. 2 further illustrates, the presence of SiTH/IRM material 120 and/or other hardmask material following the etchback is shown by diagram 204. However, as diagram 204 illustrates, utilizing an etchback to remove excess hardmask material can result in complete hardmask removal in areas corresponding to wide-pitched features, thereby resulting in inaccurate etching following resist removal. In particular, diagram 204 shows that for narrow-pitched features, e.g., features having relatively small resist/space critical dimensions (CDs), etchback can be utilized to obtain masking areas with substantial accuracy as shown by areas 210. However, for features with larger CD, such as the masking areas corresponding to areas 220 and 230, the etchback process can in some cases fail to leave sufficient hardmask material to ensure proper etching. For example, areas 220, where a relatively large portion of hardmask material has been removed, may yield only marginal etching results, while areas 230, where substantially all hardmask material has been removed from at least a portion of the desired masking area, can result in undesired etching and/or other defects.

Figure 3:
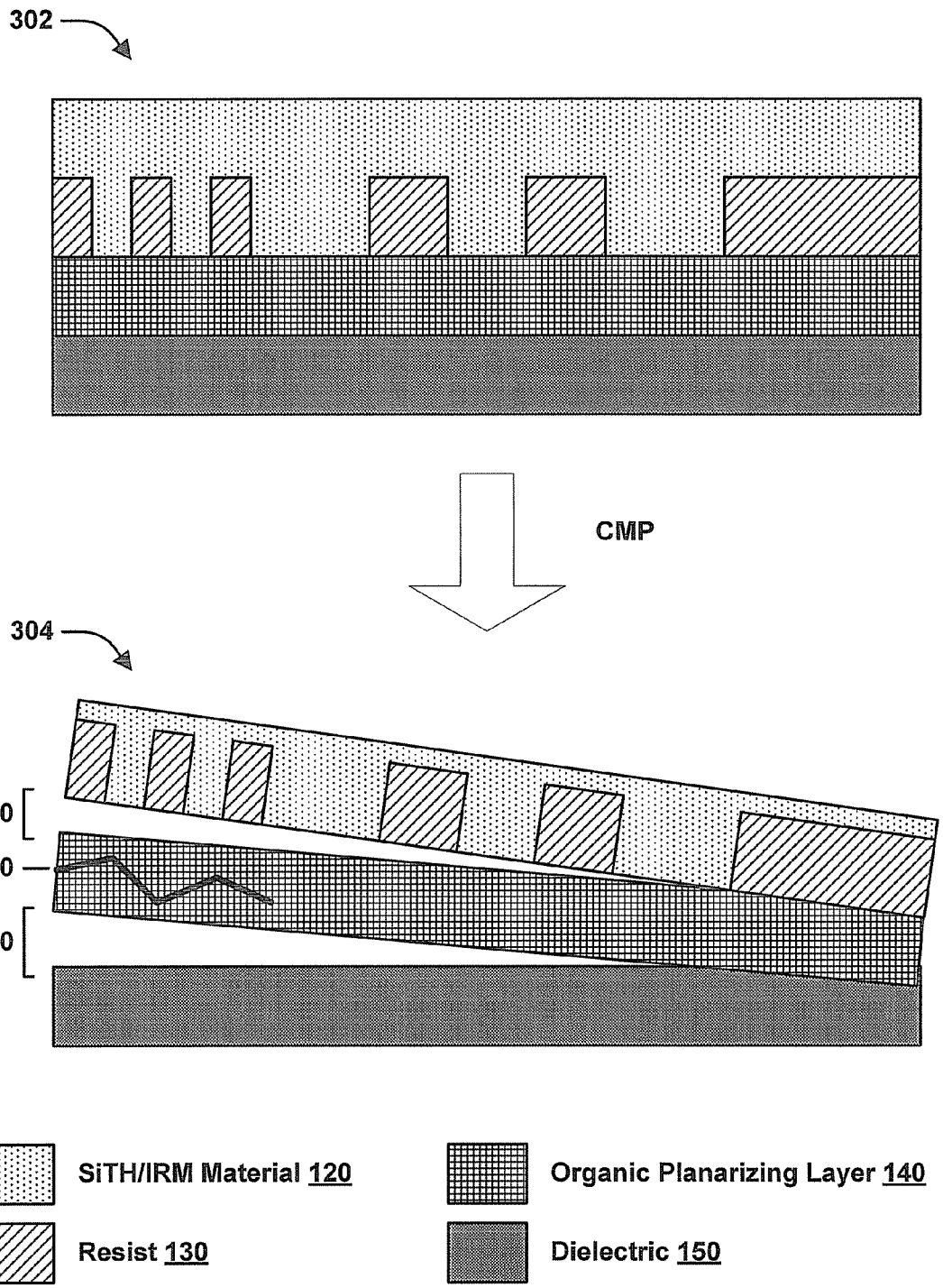

As a second example shortcoming of conventional tone-inversion lithography techniques, organic planarizing layer utilized for tone inversion in some cases exhibits a substantially high degree of vulnerability to damage in the event that CMP is used to remove excessive hardmask material. Thus, for example, as illustrated by FIG. 3, if excessive SiTH/IRM material 120 as shown in diagram 302 is removed via CMP, the vulnerability of organic planarizing layer 140 to the downforce utilized in the CMP process can cause delamination 310 between respective layers, cracking 320, and/or other similar damage, as illustrated by diagram 304.

Figure 4:
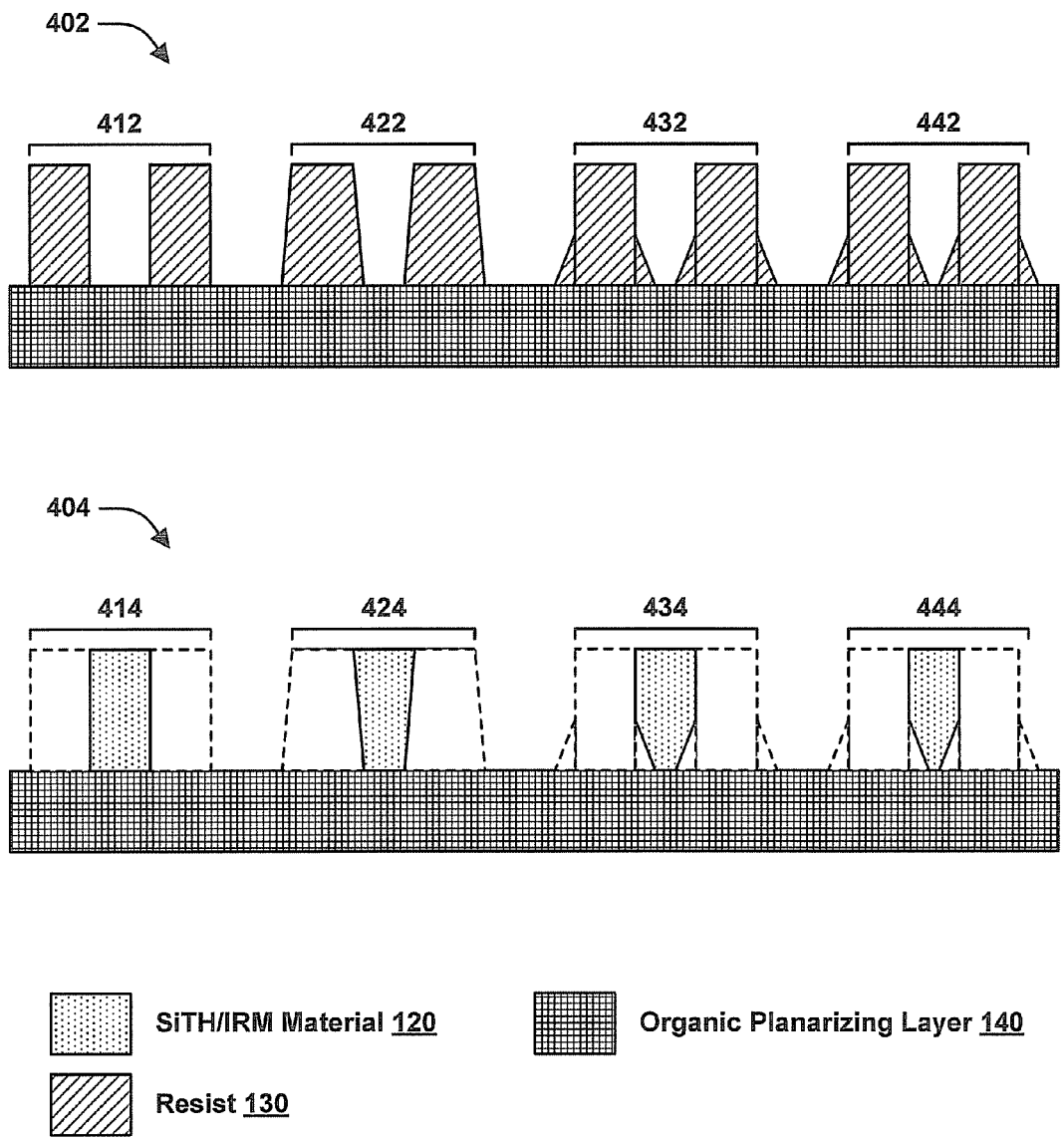

As a third example shortcoming of conventional tone inversion techniques, resist profile irregularities, intra-level overlay (e.g., resulting from irregularities in a double exposure process, etc.), and/or other factors can adversely impact the profile of SiTH/IRM material 120 and/or other hardmask material after removal of the resist 130. By way of example, FIG. 4 illustrates various photoresist irregularities that can occur during patterning and their resulting mask defects. In particular, diagram 402 in FIG. 4 shows a set of possible resist configurations post double exposure, and diagram 404 illustrates the resulting SiTH/IRM masking following etchback (or CMP and/or other techniques) and resist removal.

As illustrated by configurations 412-414 in FIG. 4, a straight resist configuration with no irregularities will in kind result in a straight mask with no defects. However, as shown by the remaining configurations in FIG. 4, irregularities in the photoresist can in some cases result in irregularities or defects in the hardmask material. For example, tapered photoresist, as illustrated by configuration 422, can result in SiTH/IRM material with CD bias before and/or after inversion, as shown by configuration 424. In a second example, photoresist that is straight at the top but with footing at the bottom, as shown by configuration 432, can result in a SiTH/IRM mask that exhibits flopover, wiggling, line edge roughness (LER), and/or other defects. Similarly, in a third example, photoresist with footing and overlay as shown by configuration 442 can result in a greater degree of flopover wiggling, LER, or the like, as shown by configuration 444.

According to an embodiment, to mitigate at least the shortcomings of conventional tone inversion lithography techniques as described above, techniques are described herein for enhanced tone inversion patterning. In one example, an improved tone inversion patterning scheme as provided herein can utilize a photoresist layer and an organic planarizing layer that are applied to a stack of two dielectric layers separated by a metal layer. Using this structure, etching can be performed using the resist as a mask in a similar manner to conventional (e.g., non-tone inversion) photolithography. The etching can be configured to stop once the top of the metal layer below the first dielectric layer is reached, at which point metal, metal film, and/or organic film can be deposited onto the etched stack. A CMP, etchback, or other process can be utilized to remove any overburden of the deposited material, at which point the remaining material can be utilized as a hardmask to etch the tone inversion pattern into the second dielectric layer. According to various embodiments, respective acts that can be performed in a tone inversion lithography process according to the above are illustrated by FIGS. 5 to 11.

Figure 5:
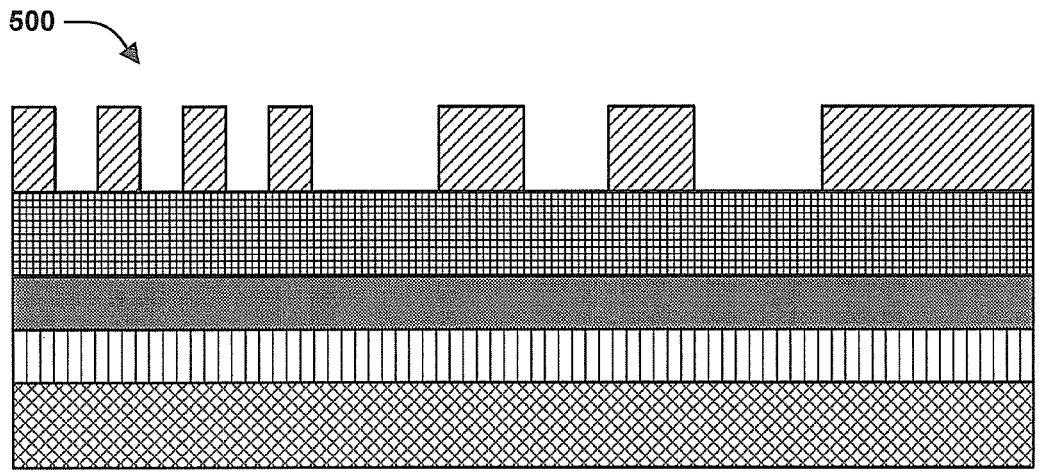
FIGS. 5 to 11 illustrate respective example semiconductor processing steps that can be performed in connection with an improved tone-inversion lithography process in accordance with various embodiments of the subject innovation.

Turning first to diagram 500 in FIG. 5, a stack utilized for semiconductor device fabrication via tone inversion lithography can include a resist layer 130 and an organic planarizing layer 140, which can be applied onto a first dielectric 510 and a second dielectric 530 separated by a metal layer 520. As further shown in diagram 500, an exposure and development process can be utilized to form a resist mask pattern in the resist layer 130. In one example, organic planarizing layer 140 can be formed using anti-reflective material in order to prevent excess photoresist from being removed during development due to reflections during exposure.

Figure 6:
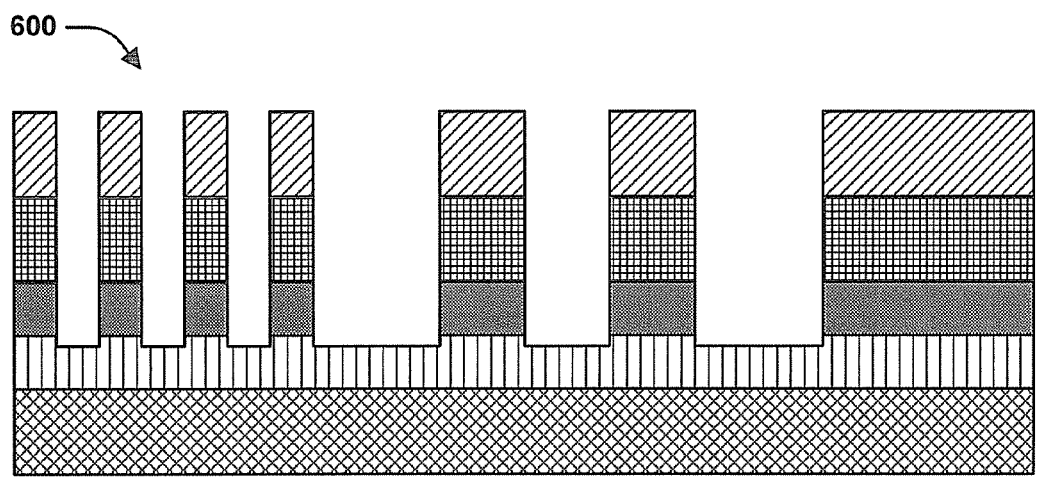

Upon exposure and development, etching can be performed as shown by diagram 600 in FIG. 6 to remove material corresponding to the organic planarizing layer 140 and first dielectric 510 that are not protected by the resist 130. As further illustrated by diagram 500, etching at this stage can be configured to cease once the metal layer 520 is reached. Etching as illustrated by diagram 600 can be performed using any suitable etching technique as generally known in the art, such as wet etching, plasma etching (e.g., "dry" etching), or the like.

Figure 7:
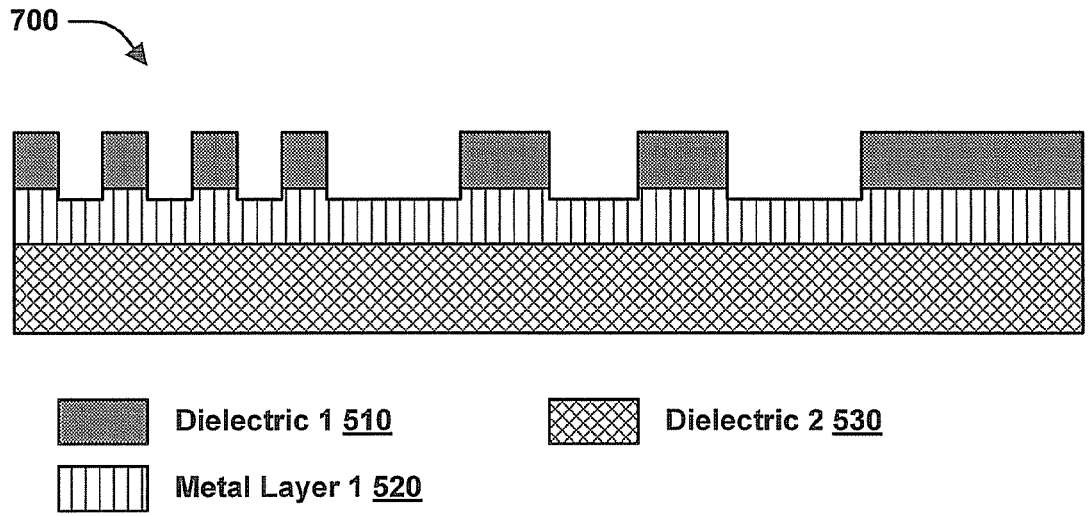

Once etching of the organic planarizing layer 140 and first dielectric 510 are completed as shown by diagram 600, the resist 130 and organic planarizing layer 140 can be removed as shown by diagram 700 in FIG. 7. Removal of the resist 130 and organic planarizing layer 140 can be performed in any suitable manner, such as via ashing, applications of chemical strippers and/or other similar substances, and/or any other technique(s).

Upon removal of the resist 130 and organic planarizing layer 140, a mask can be applied to the remaining semiconductor stack for tone inversion etching in a variety of manners. In a first example illustrated by diagram 800 in FIG. 8, a layer of selective metal growth 810 can be applied to areas of metal layer 520 that have been exposed as a result of initial etching (e.g., as illustrated by diagram 600 in FIG. 6). Alternatively, in a second example illustrated by diagram 902 in FIG. 9, a layer of metal/organic film 910 can be deposited onto the surface of first dielectric 510 and the exposed areas of metal layer 520. Following metal/organic film deposition as shown by diagram 902, CMP, etchback, and/or other suitable techniques can be utilized to remove overburden of metal/organic film 910 on top of first dielectric 510, thereby resulting in pockets of metal/organic film 910 as shown by diagram 904.

Figure 8:
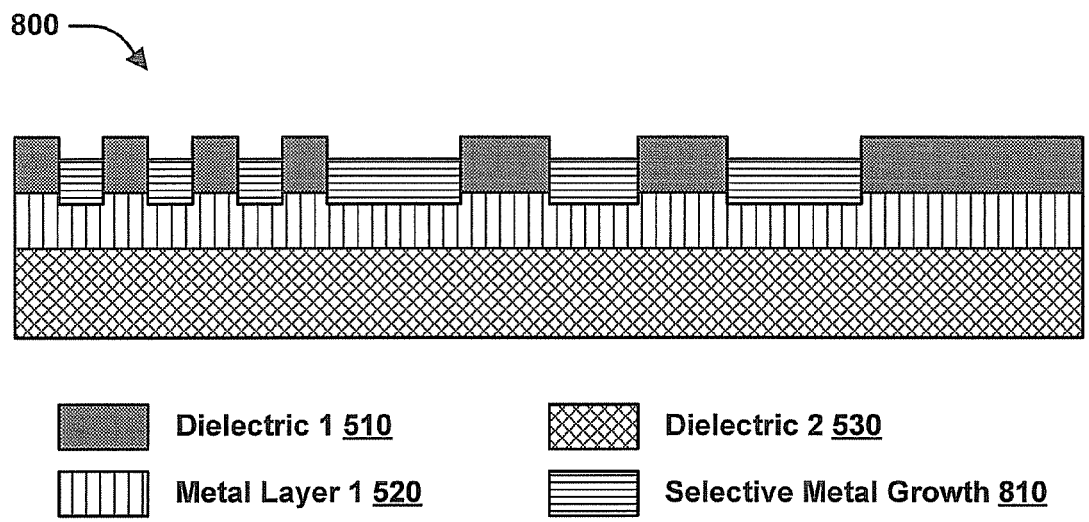
Figure 9:
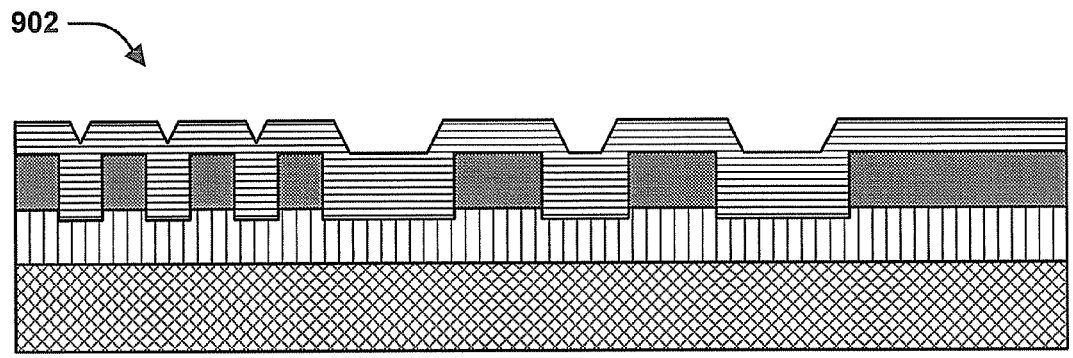
Figure 9:
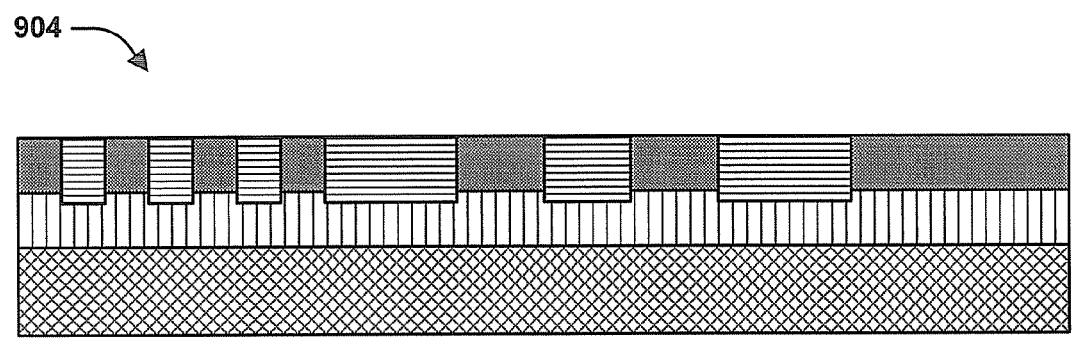

According to an embodiment, application of selective metal growth 810 as shown in FIG. 8 and/or deposition of metal/organic film 910 as shown in FIG. 9 can be performed in any suitable manner. For example, metal growth and/or metal film growth can be performed via electroless deposition or plating, which is a process by which one or more thin layers of material(s) are deposited onto a substrate. Generally, this process involves the immersion of the substrate in a plating or deposition bath that contains ions of the material to be deposited, which in turn causes some of these ions to precipitate onto the surface of the substrate. Unlike electroplating techniques, it can be appreciated that electroless deposition or plating does not require an externally applied electric field to facilitate ion deposition. In one example, electroless deposition or plating can be selective, e.g., the deposition can be configured to occur only onto areas that demonstrate appropriate electrochemical properties. For example, the ions can be deposited primarily on respective portions of the substrate that are composed of a material substantially identical to, or exhibiting affinity to, the material being deposited. In another example, portions of the substrate can be treated or activated with a catalyst to cause the ion deposition on said portions to occur at a rapid rate. The material or catalyst applied before deposition is generally referred to in the art as a "seed material" or "seed layer," and the ratio of the deposition rate on the activated regions to the deposition rate at the non-activated regions is generally referred to as the "plating process selectivity." In one example, the deposition rate can additionally depend on the physical characteristics of the activated area(s), e.g., dimensions, aspect ratios, profiles of the exposed surfaces, distances between areas to be activated, etc. For some applications of electroless plating or deposition, it can be advantageous to provide deposition of uniform thickness, to exhibit high selectivity, and to ensure that the deposited film strongly adheres to the substrate.

A variety of surface activation techniques that precede electroless plating or deposition can be utilized as generally known in the art. For example, an application of electroless plating to integrated circuit manufacturing can include the deposition of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor, such as silicon dioxide or a polymeric insulator. The reported surface activation techniques applied to these substrates usually fall into one of four categories: (1) catalyst film deposition by evaporation or sputtering, (2) catalyst film deposition by electrochemical or chemical surface modification, (3) catalytic film deposition from a colloidal suspension, and (4) photon-enhanced activation by laser or wide spectrum irradiation.

Metals of Group VIII, such as palladium and platinum, can be utilized as catalytic surface activators in electroless deposition or plating methods. Catalytic films of palladium or platinum for subsequent electroless deposition can be readily deposited by evaporation or sputtering techniques. The films deposited with these techniques can be patterned by well-known lithographic techniques, e.g., subtractive etching or liftoff. Large features and/or dense patterns of small features are relatively easy to plate with this method.

In another example, metal growth and/or metal/organic film deposition can be performed via ALD, which is a thin film deposition technique that is based on the sequential use of a gas phase chemical process. According to an embodiment, ALD reactions can utilize two chemicals, often referred to as precursors. These precursors can react one at a time with a surface in a sequential manner, and by exposing the precursors to the growth surface repeatedly, a thin film can be deposited. In one example, the growth of material via ALD can be conducted by repeating a series of four steps: (1) exposure of a first precursor; (2) purging or evacuation of the reaction chamber to remove non-reacted precursors and gaseous reaction by-products; (3) exposure of a second precursor, or an additional treatment to reactivate the surface for the reaction of the first precursor; and (4) a second purging or evacuation of the reaction chamber. Each of these reaction cycles can add a given amount of material to the surface, which can be referred to as the growth per cycle. To grow a material layer via ALD, reaction cycles can be repeated as many times as required for the desired film thickness. Prior to beginning the ALD process, the surface can be stabilized to a known, controlled state, e.g., by a heat treatment. As ALD is composed of self-terminating reactions, ALD is a surface-controlled process, wherein process parameters other than the precursors, substrate, and temperature have little or no influence. These properties enable films grown via ALD to exhibit a high degree of conformity and uniformity.

More generally, it can be appreciated that any suitable CVD process, including ALD and/or any other suitable CVD process, can be utilized to deposit metal and/or organic film as described herein. In general, CVD can refer to any process that involves the exposure of a substrate to one or more volatile precursors, which can react and/or decompose on the substrate surface to produce the desired deposit. Alternatively, deposition of metal and/or organic film can be conducted via a PVD process, by which a thin film is deposited by the condensation of a vaporized form of the material to be deposited onto the semiconductor surface. By definition, coating methods utilized in connection with PVD can utilize purely physical processes, such as high temperature vacuum evaporation, plasma sputter bombardment, or the like. It should be appreciated, however, that metal growth as shown by FIG. 8 and/or metal/organic film deposition as shown by FIG. 9 can be realized by any suitable techniques, and the above examples are provided merely as non-limiting examples. It should be further appreciated that, unless explicitly stated otherwise, the hereto appended claims are not intended to be limited to any specific technique(s) for depositing material onto a semiconductor surface or otherwise causing material to be applied to such a surface.

As described above with reference to FIG. 3, it can be appreciated that the use of CMP to strip away material overburden in the context of conventional tone inversion lithography processes can result in delamination, cracking, and/or other defects. Such defects are caused by, for example, the relatively low strength of the resist 130 and organic planarizing layer 140, which are generally used for patterning in the tone inversion process. In contrast, a first dielectric 510 and metal layer 520 as utilized in FIG. 9 can be chosen that have a substantially higher strength than that of resist 130 and organic planarizing layer 140, such that removal of the overburden of metal/organic film 910 can be performed using CMP and/or other suitable processes with substantially reduced cracking, delamination, and/or other defects.

Figure 10:
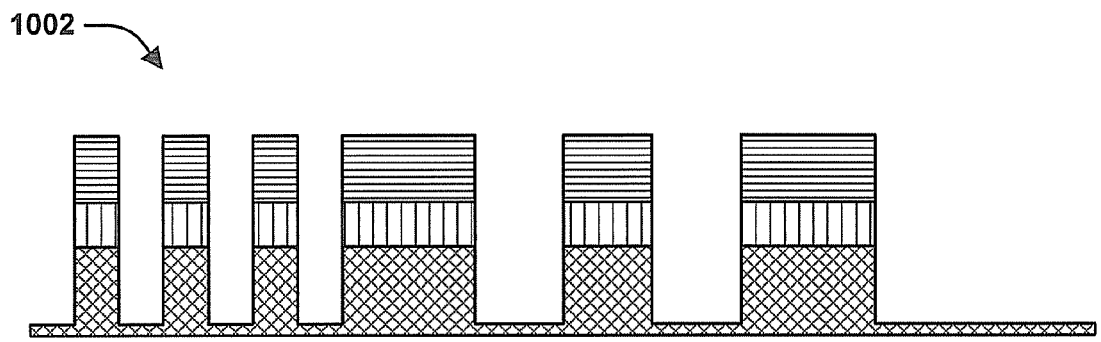
Figure 10:
Figure 10:
Figure 10:
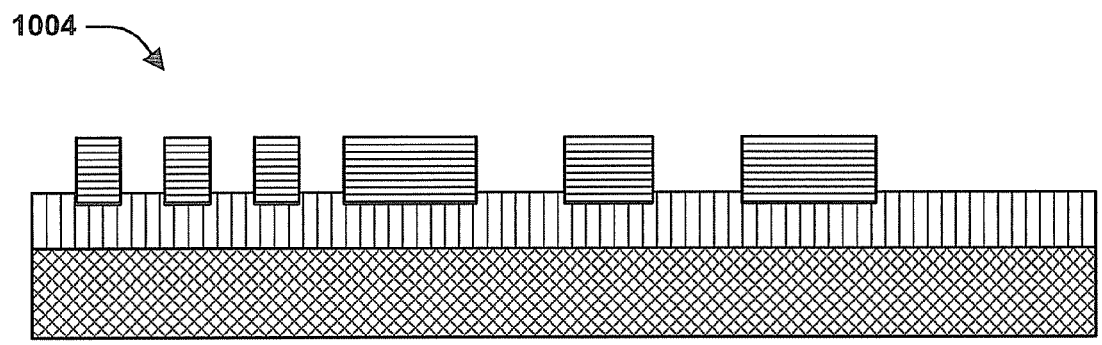
Figure 10:
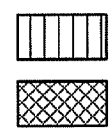
Figure 10:
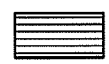

Upon completion of selective metal growth as shown by FIG. 8 and/or film deposition as shown by FIG. 9, processing can continue as shown by diagram 1002 in FIG. 10, wherein etching is performed on the first dielectric layer 510 (not shown in FIG. 10), the metal layer 520 and a second dielectric layer 530 using the previously deposited material as a hardmask. While diagram 1002 illustrates the use of metal/organic film 910 as a hardmask, it should be appreciated that selective metal growth 810 and/or any other suitable material(s) could be used. According to an embodiment, etching as shown in FIG. 10 can be performed according to any suitable technique(s) for etching as generally known in the art. These can include, but are not limited to, wet etching, dry (e.g., plasma) etching, or the like.

In an alternative example, the remaining portions of the first dielectric layer 510 can be removed by wet chemistry and/or other means as shown by diagram 1004 prior to etching as shown by diagram 1002. This can be done, for example, to obtain a topography for improved etching (e.g., a topography for an improved reactive-ion etching (RIE) process window).

Figure 11:
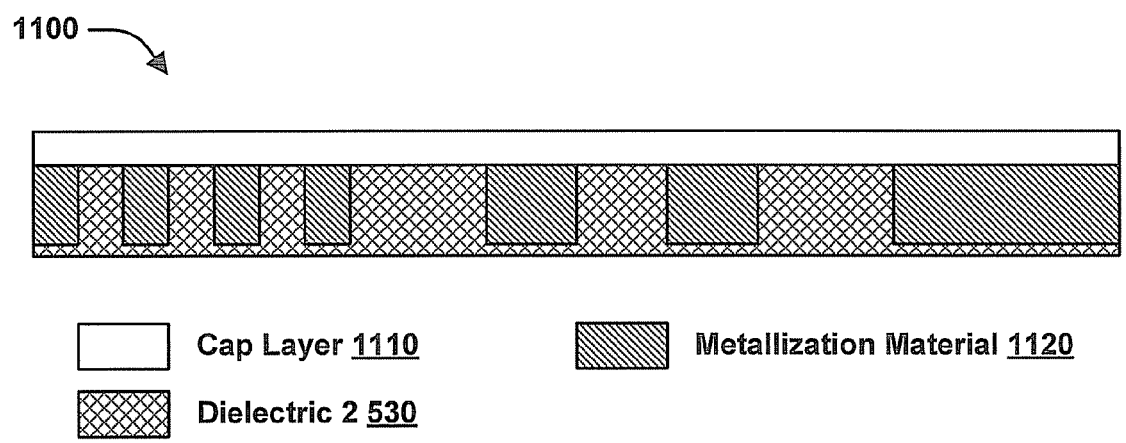

Upon completion of etching as shown in FIG. 10, fabrication of a semiconductor device can be concluded as shown by diagram 1100 in FIG. 11. As FIG. 11 more particularly illustrates, subsequent to etching of the second dielectric 530, CMP, etchback, and/or another suitable removal process can be utilized to remove the selective metal growth 810, metal/organic film 910 and/or other materials utilized for masking during etching as shown by FIG. 10, as well as the metal layer 520 located below the mask material. Next, a metallization process can be utilized, wherein a metallization material 1120 is deposited into one or more spaces in the second dielectric 530 created by etching as shown in FIG. 10. Processing as shown in FIG. 11 can then conclude by the deposition of a cap layer 1110 or the like onto the surface of the semiconductor device.

Figure 12:
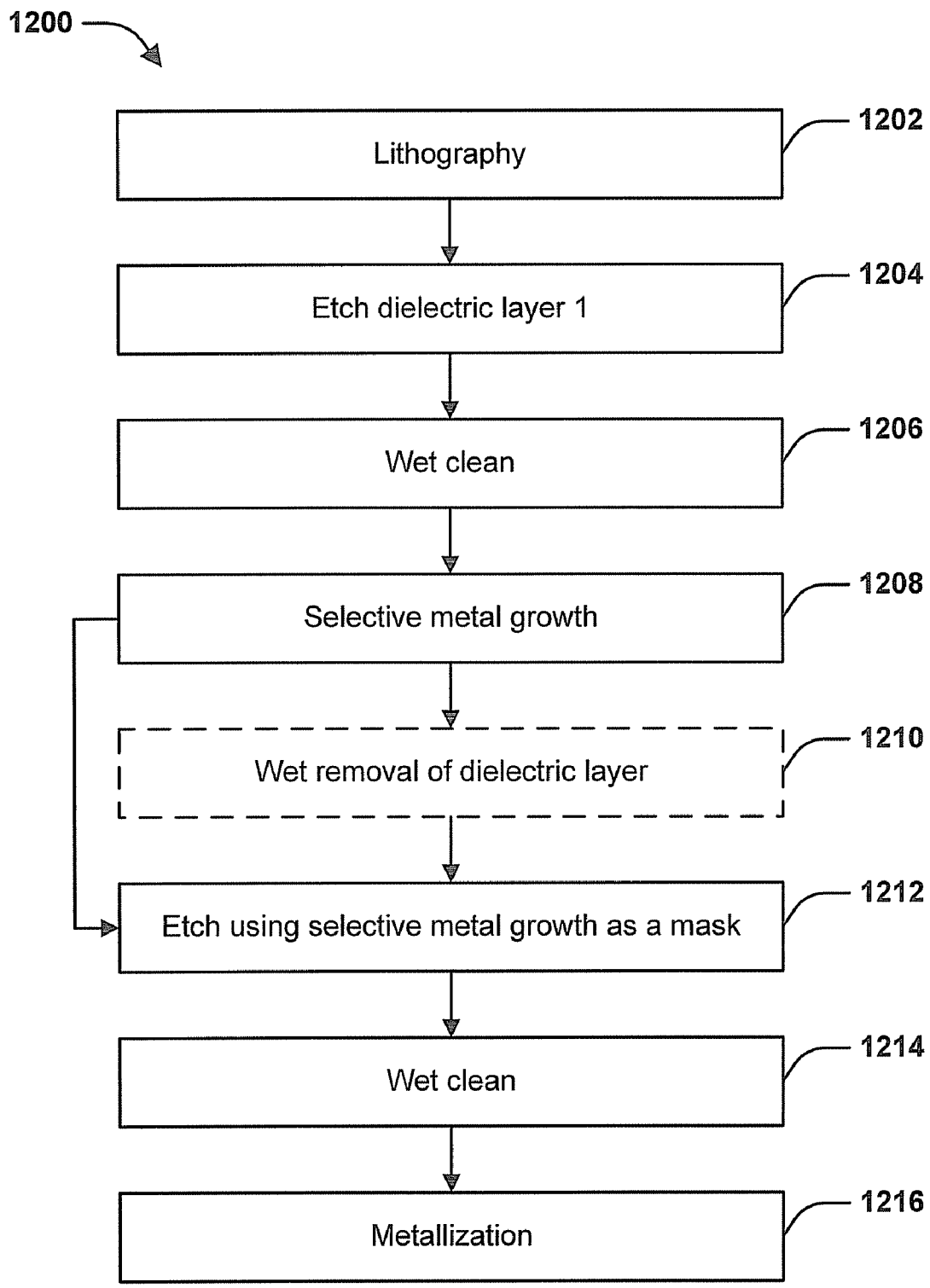
FIGS. 12 to 13 are flow diagrams of respective example methodologies for fabricating a semiconductor device via tone-inversion lithography in accordance with respective embodiments of the subject innovation.
Figure 13:
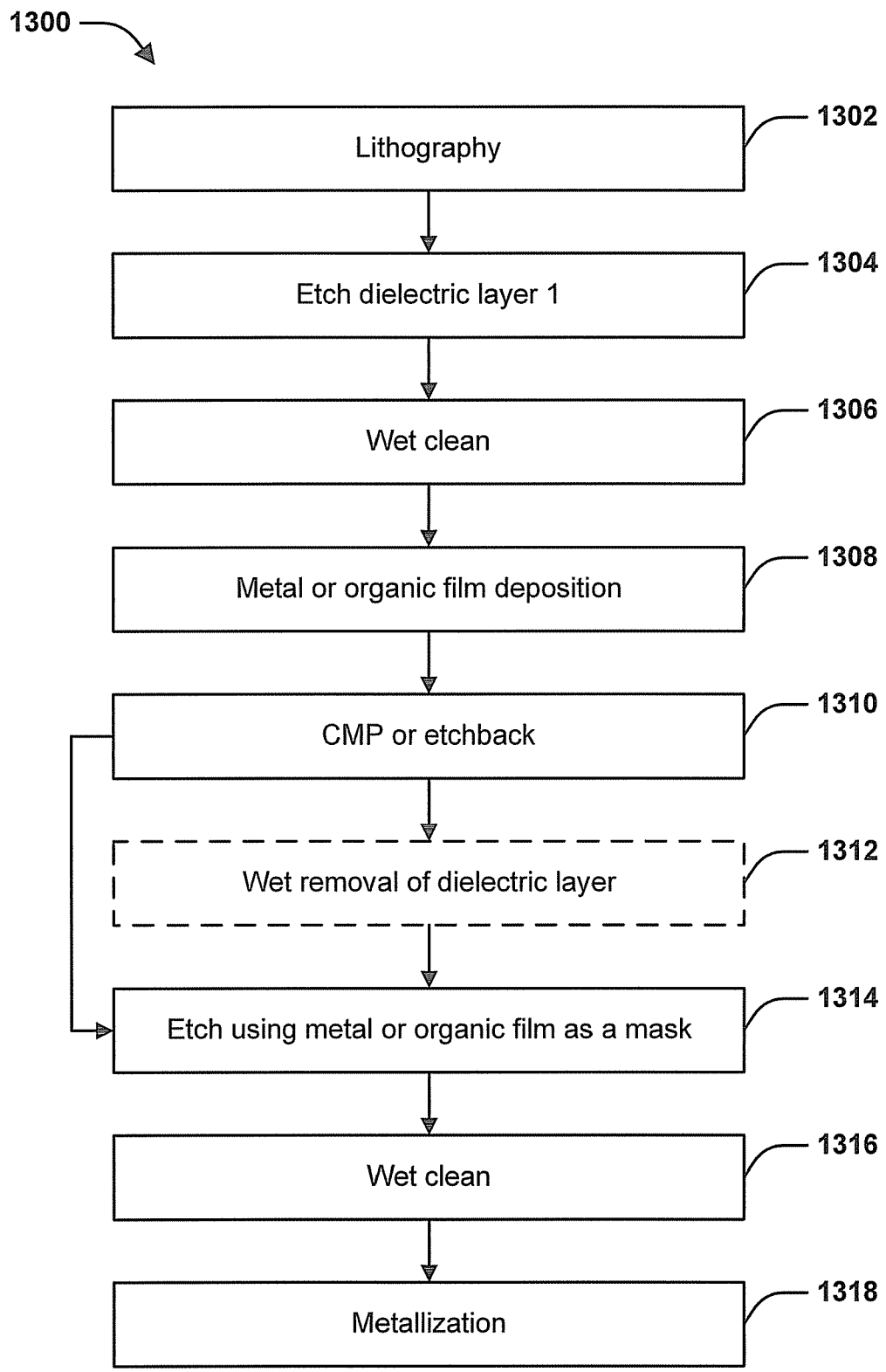

Turning next to FIGS. 12 to 13, techniques for fabricating a semiconductor device according to at least the embodiments described above are presented. It should be appreciated, however, that the techniques illustrated in FIGS. 12 to 13 and described below are intended merely as non-limiting examples of techniques that can be utilized for semiconductor device fabrication. Unless explicitly stated otherwise, the techniques provided in the following description are not intended to be limited to the structures described above or any other specific structure(s).

As described above, various embodiments described herein provide techniques for semiconductor device fabrication that initially leverage the use of etching using a resist layer as a mask in a similar manner to that performed in conventional non-tone inversion lithography. This etching can be configured to stop at the top of the metal layer below the dielectric layer. Next, metal or organic film can be deposited by either electroless deposition, epitaxial growth, CVD/PVD/ALD, and/or any other suitable technique(s). Any of the overburden of this material on top of the dielectric can be removed by CMP or an etchback process, after which the remaining material can be used as a hardmask. This hardmask can, in turn, be used to etch the dielectric in order to obtain the tone-inversion pattern.

With specific reference now to FIG. 12, an example methodology for conducting at least partial fabrication of a semiconductor device via tone-inversion lithography is illustrated by flow diagram 1200. As flow diagram 1200 illustrates, an example semiconductor device fabrication methodology can include initial lithography at 1202, followed by etching of a first dielectric layer at 1204 and a wet clean at 1206. Next, selective metal growth (e.g., selective metal growth 810) can be applied to exposed portions of a metal layer under the first dielectric layer resulting from the etching at 1204. Optional wet removal of the dielectric layer can follow at 1210, or alternatively the methodology can continue to 1212 wherein etching is performed using the selective metal growth applied at 1208 as a mask. Upon completion of the etching at 1212, the methodology can conclude with a wet clean at 1214 and metallization at 1216.

Turning next to FIG. 13, a second example methodology for conducting at least partial fabrication of a semiconductor device via tone-inversion lithography is illustrated by flow diagram 1300 in FIG. 13. As flow diagram 1300 illustrates, an example semiconductor device fabrication methodology can include initial lithography at 1302, followed by etching of a first dielectric layer at 1304 and a wet clean at 1306. Next, deposition of metal or organic film (e.g., metal/organic film 910) can occur at 1308, and excess film can be removed via CMP or etchback at 1310. Optional wet removal of the dielectric layer can follow at 1312, or alternatively the methodology can continue to 1314 wherein etching is performed using the metal or organic film applied at 1308 as a mask. Upon completion of the etching at 1314, the methodology can conclude with a wet clean at 1316 and metallization at 1318.

With reference again generally to FIGS. 5 to 11, a first dielectric layer 510, a metal layer 520, and deposited materials (e.g., selective metal growth 810 and/or metal/organic film 910) can utilize one or more materials that can be selected from a variety of candidate materials. According to an embodiment, the first dielectric layer 510 can be a material having a high selectivity to metals, such as $SiO_2$, SiN, SiON, SiCOH, or the like. Alternatively, the first dielectric layer can be a material that is soluble on wet chemistry, such as a combination of diluted hydrofluoric acid (DHF) and high hydrogen containing SiN.

According to another embodiment, materials chosen for the metal layer 520 as described herein can be dependent on the deposition method utilized. For example, in the case of selective growth, materials such as TiN or TaN can be utilized via deposition according to a CVD, PVD, ALD, and/or other suitable method. In the event that metal deposition by CVD, PVD, ALD, or the like is utilized, then a metal with a barrier property (e.g., Ti, TiN, Ta, TaN, etc.) can be utilized.

According to a further embodiment, the deposited material (e.g., selective growth or deposited film) can be selected based on the deposition method utilized. For example, in the case of selective growth, a primary metal (e.g., approximately 80% of the composition) can be chosen from a list of candidates including, but not limited to, Co, Ni, Cu, Fe, Ru, Rh, Pd, Ag, Os, Ir, Sn, Pb, Pt, and/or Au. Further, a co-deposit metal (e.g., ≦approximately 5% of the composition) can be chosen from a list of candidates including, but not limited to, V, Cr, Mn, Mo, Tc, W, Re, In, Ti, Zn, Si, Ge, and/or B. Alternatively, in the case of metal deposition, candidate metals for deposition can be chosen from a set of candidates including, but not limited to, W, Cu, Ti, TiN, Ru, Ta, TaN, Co, Ni, and/or Si, as well as carbon or alloys combined with any of these material(s). According to an embodiment, Ti, TiN, Ta or TaN can be deposited in advance as a first layer. In another alternative, in the case of organic film deposition, amorphous carbon and/or any other suitable material(s) can be utilized as the organic material for film deposition.

According to an additional embodiment, various layers as utilized in the processes illustrated by FIGS. 5 to 11 can exhibit respective thicknesses as deemed suitable for the fabrication process being used. Accordingly, the following provides various specific, non-limiting examples of thicknesses that can be utilized for various layers described herein. It should be appreciated, however, that any suitable thickness can be utilized for any layer(s) as provided herein. Further, it should be appreciated that, unless specifically stated otherwise, neither the embodiments described herein nor the claimed subject matter is intended to be limited to such examples unless explicitly stated otherwise. In one example, the first dielectric layer 510 can be from approximately 10 nm to approximately 100 nm thick and the metal layer 520 can be approximately 5 nm to approximately 20 nm thick. In another example, selective metal growth, as shown by FIG. 8, and/or film deposition, as shown by FIG. 9, can occur in one layer or two layers. According to an embodiment, an initial layer of deposited material (if needed) can be from approximately 1 nm to 10 nm thick, while the second layer (e.g., main material) can be from approximately 10 nm to approximately 300 nm thick.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

Further, while certain embodiments have been described above, it is to be appreciated that these embodiments have been presented by way of example only, and are not intended to limit the scope of the claimed subject matter. Indeed, the novel methods and devices described herein may be made without departing from the spirit of the above description. The accompanying claims and their equivalents are intended to cover such forms or modifications as would fall within the scope and spirit of the subject innovation.

In addition, it should be appreciated that while the respective methodologies provided above are shown and described as a series of acts for purposes of simplicity, such methodologies are not limited by the order of acts, as some acts can, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

What is claimed is:

1. A method for fabricating a device, comprising:
   forming a structure on a substrate, the structure having a lower dielectric layer on the substrate, a metal layer on the lower dielectric layer, an upper dielectric layer on the metal layer, a planarizing layer on the upper dielectric layer, and a layer of photoresist material on the planarizing layer;
   developing the photoresist material according to a mask pattern;
   etching the planarizing layer and the upper dielectric layer according to the mask pattern;
   removing the photoresist material and the planarizing layer upon etching of the planarizing layer and the upper dielectric layer;
   applying a selective metal growth to respective exposed portions of the metal layer following etching of the upper dielectric layer, thereby obtaining an inverted mask pattern composed of the selective metal growth; and
   etching at least the metal layer and the lower dielectric layer according to the inverted mask pattern.

2. The method of claim 1, further comprising removing the upper dielectric layer prior to etching the metal layer and the lower dielectric layer.

3. The method of claim 1, wherein the applying comprises applying the selective metal growth via at least one of electroless plating, epitaxial growth, chemical vapor deposition (CVD), physical vapor deposition (PVD), or atomic layer deposition (ALD).

4. The method of claim 1, wherein:
   the upper dielectric layer has a thickness between approximately 10 nm and approximately 100 nm; and
   the metal layer has a thickness between approximately 5 nm and approximately 20 nm.

5. The method of claim 1, wherein the applying comprises applying selective metal growth composed of at least one element selected from the group consisting of Co, Ni, Cu, Fe, Ru, Rh, Pd, Ag, Os, Ir, Sn, Pb, Pt, and Au.

6. The method of claim 1, wherein the applying comprises applying selective metal growth comprising at least one primary metal and at least one co-deposit metal.

7. The method of claim 6, wherein:
   the at least one primary metal is composed of at least one element selected from the group consisting of Co, Ni, Cu, Fe, Ru, Rh, Pd, Ag, Os, Ir, Sn, Pb, Pt, and Au; and
   the at least one co-deposit metal comprises is composed of at least one element selected from the group consisting of V, Cr, Mn, Mo, Tc, W, Re, In, Ti, Zn, Si, Ge, and B.

8. The method of claim 1, further comprising:
   removing the selective metal growth and the metal layer following etching of the metal layer and the lower dielectric layer;
   metalizing one or more portions of the lower dielectric layer that are removed as a result of the etching of the lower dielectric layer; and
   forming a cap layer on the lower dielectric layer upon completion of the metalizing.

9. A method for fabricating a device, comprising:
forming a structure on a substrate, the structure having a lower dielectric layer on the substrate, a metal layer on the lower dielectric layer, an upper dielectric layer on the metal layer, a planarizing layer on the upper dielectric layer, and a layer of photoresist material on the planarizing layer;
developing the photoresist material according to a mask pattern;
etching the planarizing layer and the upper dielectric layer according to the mask pattern;
removing the photoresist material and the planarizing layer upon etching of the planarizing layer and the upper dielectric layer;
depositing a metal or organic film on the upper dielectric layer and respective exposed portions of the metal layer following etching of the upper dielectric layer;
removing respective portions of the metal or organic film that are located on one or more portions of the upper dielectric layer, thereby obtaining an inverted mask pattern composed of the metal or organic film; and
etching at least the metal layer and the lower dielectric layer according to the inverted mask pattern.

10. The method of claim 9, further comprising removing the upper dielectric layer prior to etching the metal layer and the lower dielectric layer.

11. The method of claim 9, wherein the depositing comprises depositing the metal or organic film via at least one of electroless plating, epitaxial growth, chemical vapor deposition (CVD), physical vapor deposition (PVD), or atomic layer deposition (ALD).

12. The method of claim 9, wherein:
the upper dielectric layer has a thickness between approximately 10 nm and approximately 100 nm; and
the metal layer has a thickness between approximately 5 nm and approximately 20 nm.

13. The method of claim 9, wherein the metal or organic film is a metal film composed of at least one of a material selected from the group consisting of W, Cu, Ti, TiN, Ru, Ta, TaN, Co, Ni, and Si; carbon combined with a material selected from the group consisting of W, Cu, Ti, TiN, Ru, Ta, TaN, Co, Ni, and Si; or an alloy combined with a material selected from the group consisting of W, Cu, Ti, TiN, Ru, Ta, TaN, Co, Ni, and Si.

14. The method of claim 9, wherein the metal or organic film is an organic film composed of amorphous carbon.

15. The method of claim 9, wherein the metal or organic film has a thickness between approximately 10 nm and approximately 300 nm.

16. The method of claim 9, wherein the depositing comprises:
depositing an initial layer of metal or organic film on the upper dielectric layer and respective exposed portions of the metal layer following etching of the upper dielectric layer; and
depositing a primary layer of metal or organic film on the initial layer of metal or organic film.

17. The method of claim 16, wherein the initial layer of metal or organic film is composed of at least one of Ti, TiN, Ta, or TaN.

18. The method of claim 16, wherein the initial layer of metal or organic film has a thickness between approximately 1 nm and approximately 10 nm.

19. The method of claim 9, further comprising:
removing the metal or organic film and the metal layer following etching of the metal layer and the lower dielectric layer;
metalizing one or more portions of the lower dielectric layer that are removed as a result of the etching of the lower dielectric layer; and
forming a cap layer on the lower dielectric layer upon completion of the metalizing.

* * * * *